United States Patent [19]
Tanoi

[11] Patent Number: 5,592,499
[45] Date of Patent: Jan. 7, 1997

[54] SEMICONDUCTOR MEMORY DEVICE

[75] Inventor: Satoru Tanoi, Tokyo, Japan

[73] Assignee: Oki Electric Industry Co., Ltd., Tokyo, Japan

[21] Appl. No.: 493,295

[22] Filed: Jun. 21, 1995

Related U.S. Application Data

[63] Continuation of Ser. No. 979,939, Nov. 23, 1992, abandoned.

[30] Foreign Application Priority Data

Nov. 26, 1991 [JP] Japan ................... 3-310318

[51] Int. Cl.$^6$ ................................. G11C 29/00
[52] U.S. Cl. ................... 371/40.1; 371/40.2; 371/51.1
[58] Field of Search ................... 371/40.1, 40.2, 371/40.4, 37.1, 10.1, 10.2, 10.3, 51.1, 182.04

[56] References Cited

U.S. PATENT DOCUMENTS

| | | |
|---|---|---|
| 4,451,922 | 5/1984 | Dearden et al. . |
| 5,003,542 | 3/1991 | Mashiko et al. ................... 371/40.1 |
| 5,012,472 | 4/1991 | Arimoto et al. ................... 371/40.1 |
| 5,056,095 | 10/1991 | Horiguchi et al. ................... 371/40.1 |
| 5,127,014 | 6/1992 | Raynham ................... 371/40.1 X |
| 5,233,610 | 8/1993 | Nakayama et al. ................... 371/40.1 X |

OTHER PUBLICATIONS

"A Study Of Array–Embedded ECC With Bit Inversion Register For MB DRAM", Tsukasa Ooishi et al., LSI Research & Development Laboratory, Mitsubishi Electric Corporation.

K. Arimoto et al, "A Speed–Enhanced DRAM Array Architecture with Embedded ECC", IEE Journal Of Solid–State Circuits, vol. 25, No. 1, Feb. 1990, pp. 11–16.

K. Furutani et al, "A Built–In Hamming Code ECC Circuit for DRAM's ", IEEE Journal Of Solid–State Circuits, vol. 24, No. 1, Feb. 1989, pp. 50–55.

*Primary Examiner*—Paul P. Gordon
*Assistant Examiner*—Brian C. Oakes
*Attorney, Agent, or Firm*—Spencer & Frank

[57] ABSTRACT

A semiconductor memory device includes a memory cell array for storing information and parity bits, a register circuit for temporarily holding the information and parity bits in respective bit register circuits, and an XOR circuit for detecting an error of logical values of the information and parity bits in accordance with a predetermined verifying matrix. The XOR circuit includes a plurality of XORs each having an input line pair for receiving information in a first direction, an input line pair for receiving information in a second direction perpendicular to the first direction, and an output line pair outputting XOR logical values in the second direction.

15 Claims, 8 Drawing Sheets

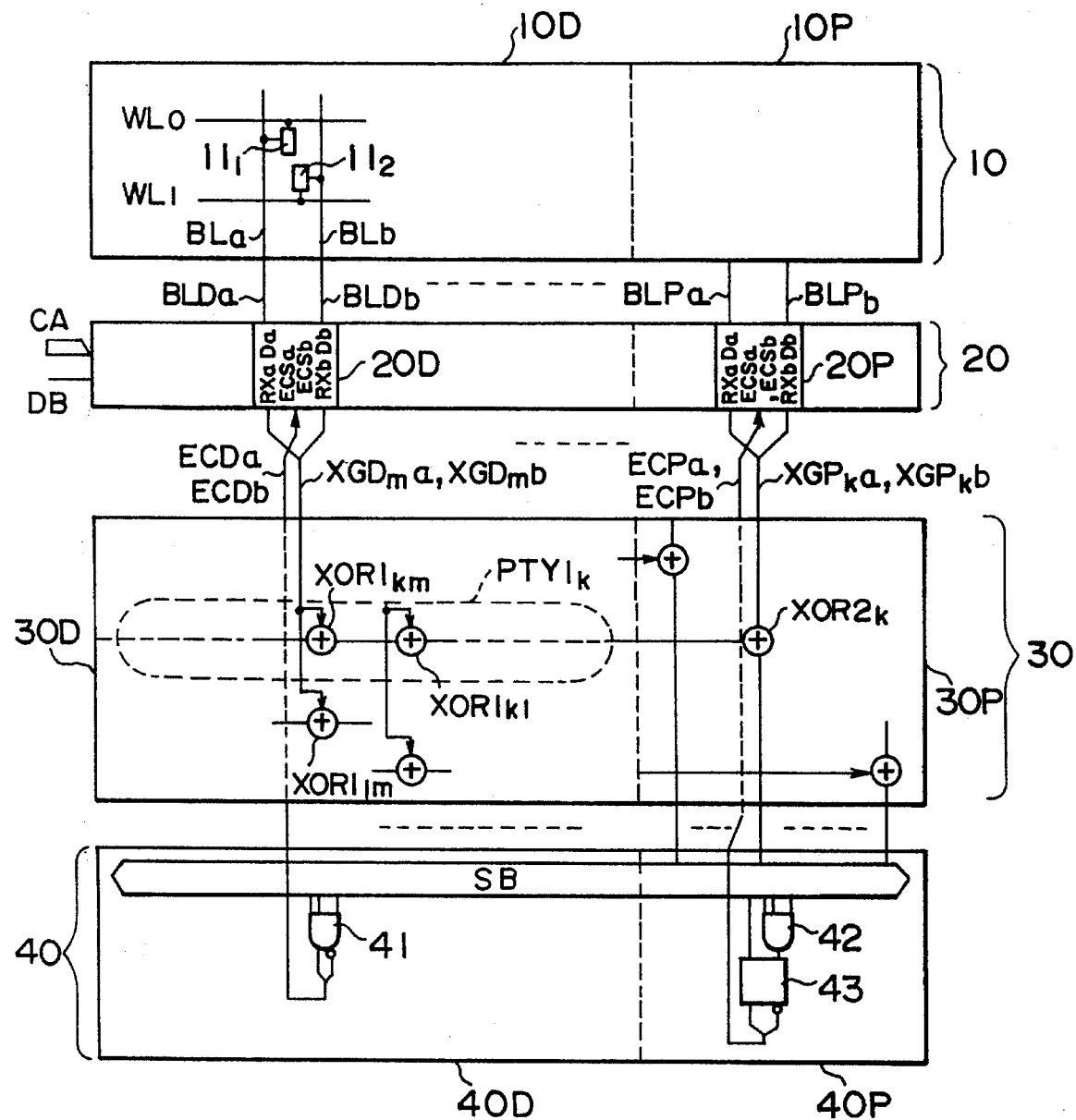
F I G. 1

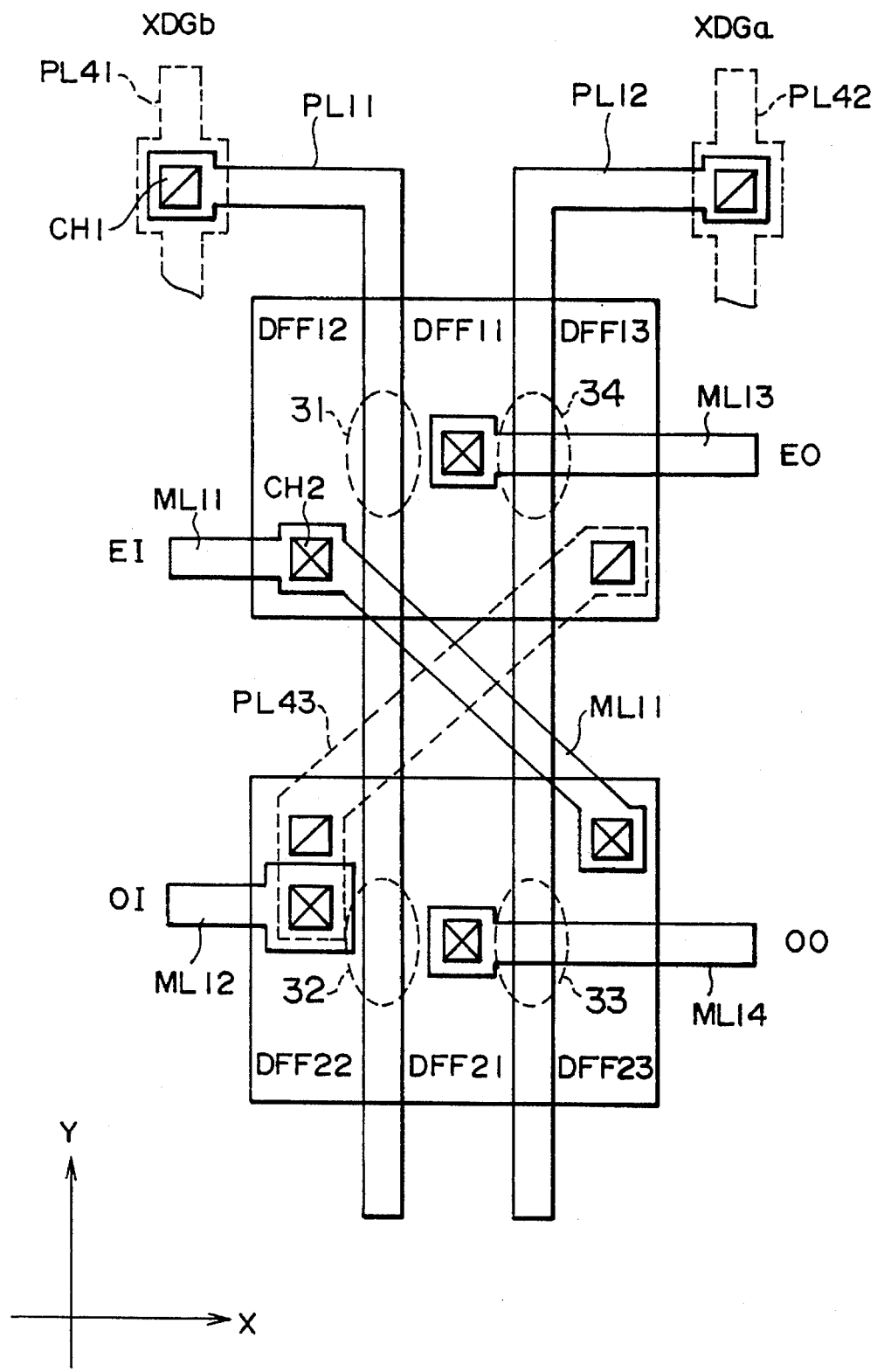
F I G. 5

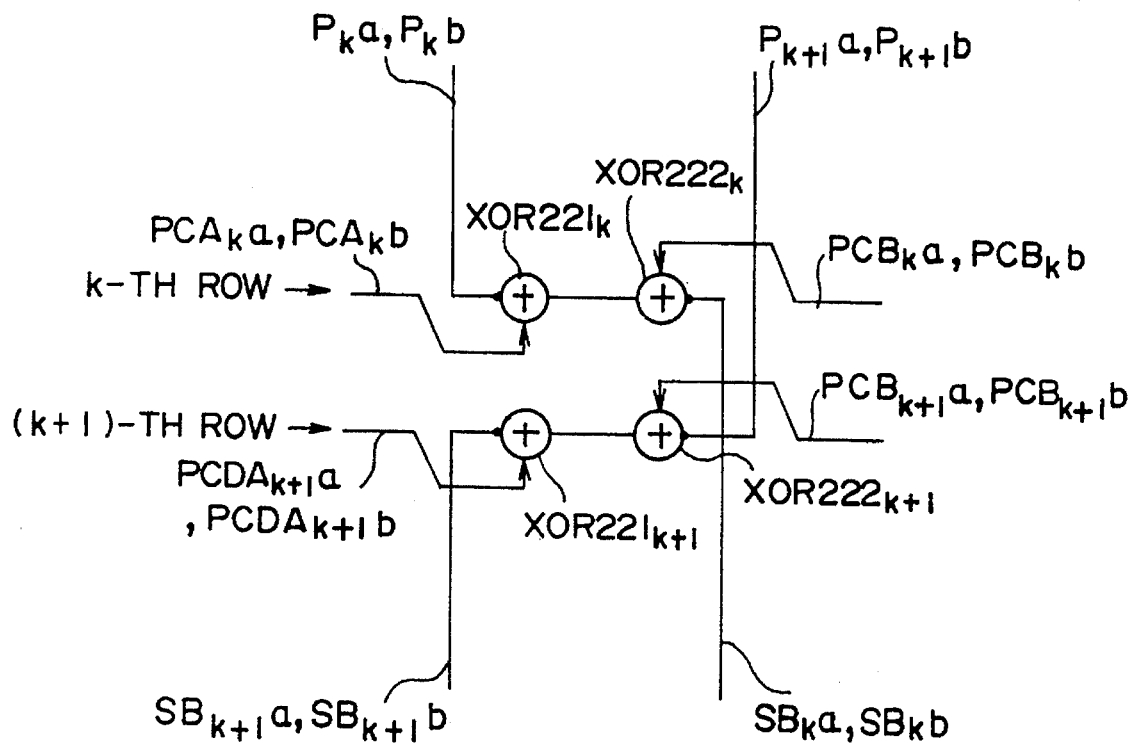
F I G. 7

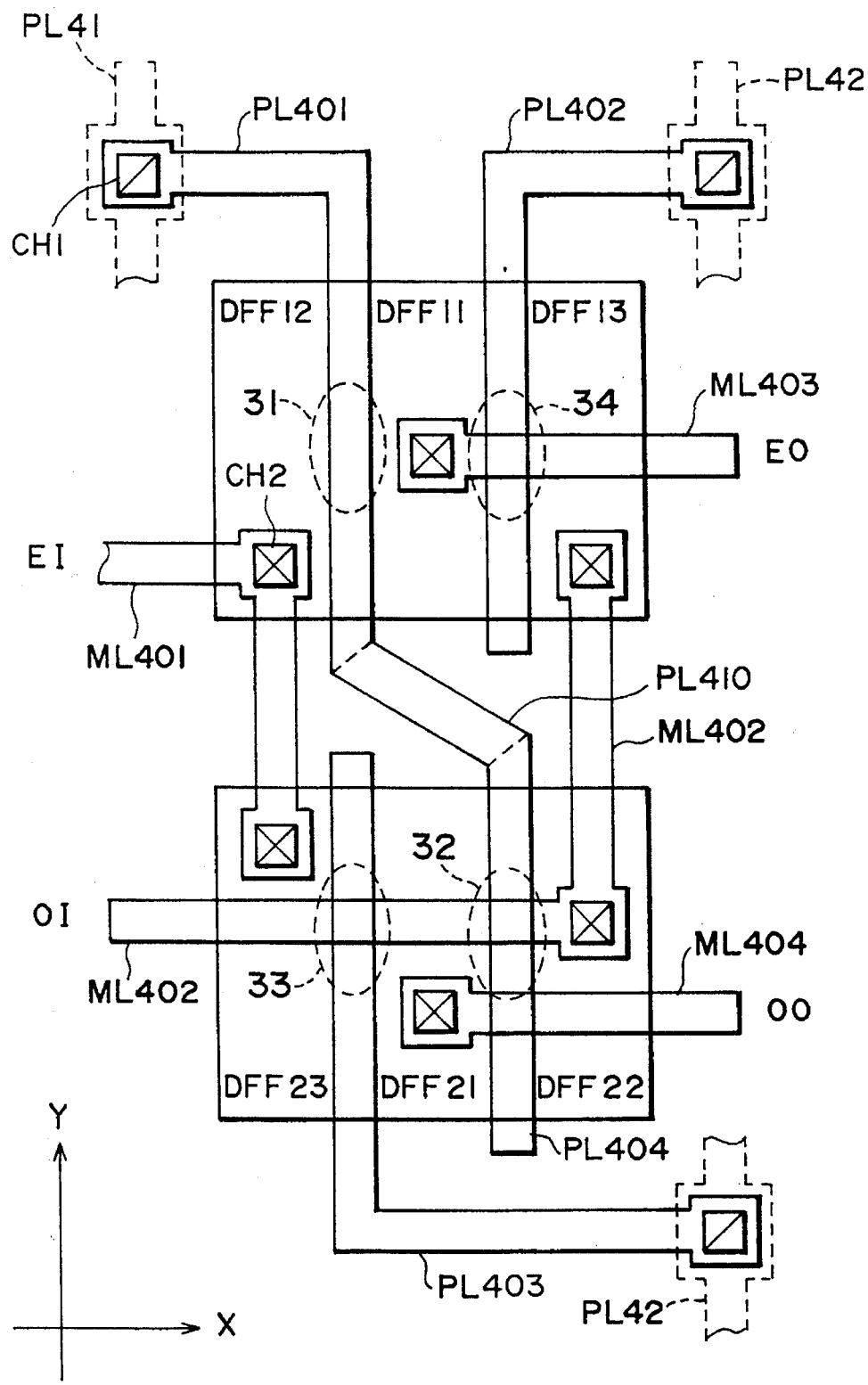
F I G. 9

SEMICONDUCTOR MEMORY DEVICE

This application is a continuation of application Ser. No. 07/979,939, filed Nov. 23, 1992 (now abandoned).

BACKGROUND OF THE INVENTION

The present invention relates to a semiconductor memory device with a built-in error correcting code (ECC) circuit.

DESCRIPTION OF THE RELATED ART

As the storage capacity of semiconductor memory devices increases, the probability of defects of memory elements also increases. To resolve such a problem, a semiconductor memory device with a built-in ECC circuit for detecting and correcting bit errors has been proposed. ECC includes single error correcting (SEC) encode (for example, Hamming code) and single error correcting/double error detecting code (SEC/DED).

So far, the following techniques in the related art as disclosed by the following documents are known.

Document 1: "A Study of Array-Embedded ECC with Bit Inversion Register for Mb DRAM" by Tsukasa Ooishi, et al., Shin-Gaku Giho SDM 90-33, ICD 90-41, pp 67–74, 1990

Document 2: "A Built-In Hamming Code ECC Circuit for DRAM's" by K. Furutani et al, IEEE Journal of Solid-State Circuits, Vol 24, No. 1, February 1989

Document 3: U.S. Pat. No. 4,451,922

The above-mentioned documents 1 and 2 describe semiconductor memory devices using the SEC code. These semiconductor memory devices were dynamic random access memory (DRAM) with built-in ECC circuitry. These devices comprise a memory array with a plurality of information bits, a plurality of parity bits, and so forth, a column register group for temporarily holding the information bits and the parity bits, an exclusive-OR (XOR) matrix circuit for checking parity and obtaining a syndrome, and a syndrome decoder for decoding the syndrome and for correcting an error of the column register group.

On the other hand, the document 3 discloses a specific construction of a parity circuit for use in checking parity.

However, in the constructions disclosed by the above-mentioned documents, it was difficult to allow the XOR matrix circuits to operate at high speeds and to be integrated with high densities. Thus, so far, an ECC circuit built-in semiconductor memory device has not been provided satisfactorily.

SUMMARY OF THE INVENTION

An object of the present invention is to provide a semiconductor memory device which allows an XOR matrix circuit to operate at a high speed and to be integrated with high density.

To accomplish this object, the present invention is a semiconductor memory device with built-in error correcting code circuitry, comprising a memory cell array for storing a plurality of information bits and a plurality of parity bits, the memory cell array comprising a plurality of memory cells for storing the information bits or the parity bits, a register circuit for temporarily holding the plurality of information bits and the plurality of parity bits, the register circuit comprising a plurality of information bit register circuits for temporarily holding the plurality of information bits and a plurality of parity bit register circuits for temporarily holding the plurality of parity bits, an XOR matrix circuit for detecting an error of logical values of a plurality of information bits and a plurality of parity bits temporarily held in the register circuit in accordance with a predetermined verifying matrix, the XOR matrix circuit comprising a plurality of information bit XORs according to the plurality of information bits and a plurality of parity bit XORs according to the plurality of parity bits, each of the information bit XORs comprising a plurality of transistors and being cascade-connected, each of the parity bit XORs comprising a plurality of transistors with gates being connected to outputs of the information bit XORs cascade-connected, and a decode circuit for correcting a bit error of a plurality of information bits and a plurality of parity bits temporarily held in the register circuit in accordance with an error detection of the XOR matrix circuit.

Further, the present invention is a semiconductor memory device with built-in error correcting code circuit, comprising a memory cell array for storing a plurality of information bits and a plurality of parity bits, the memory cell array comprising a plurality of memory cells for storing the plurality of information bits or the plurality of parity bits; a register circuit for temporarily holding the plurality of information bits and the plurality of parity bits, the register circuit comprising a first information bit register circuit group for temporarily holding one of two blocks into which the plurality of information bits are divided, a second information bit register circuit group for temporarily holding the other block thereof, and a plurality of parity bit register circuits for temporarily holding the plurality of parity bits, an XOR matrix circuit for detecting an error of logical values of a plurality of information bits and a plurality of parity bits temporarily held in the register circuit in accordance with a predetermined verifying matrix, the XOR matrix circuit comprising a first information bit XOR group according to the first information bit register group, a second information bit XOR group according to the second information bit register group, and a plurality of parity bit XORs according to the plurality of parity bits, and a decode circuit for correcting a bit error of a plurality of information bits and a plurality of parity bits temporarily held in the register circuit in accordance with an error detection result of the XOR matrix circuit, the decode circuit comprising a first information bit decode circuit according to the first information bit XOR group, a second information bit decode circuit according to the second information bit XOR group, and a parity bit decode circuit according to the parity bit XOR group.

Moreover, the present invention is a semiconductor memory device wherein each XOR of the XOR matrix circuit comprises four MOS transistors, the first and second MOS transistors and the third and fourth MOS transistors sharing a diffused region as sources or drains thereof, the first and third MOS transistors being opposed to the second and fourth MOS transistors so that these gates are substantially disposed on the same line, the gate of the first MOS transistor being extended and connected to the gate of the fourth MOS transistor.

BRIEF DESCRIPTION OF THE DRAWINGS

These and other features and advantages of the invention may be more completely understood from the following detailed description of the preferred embodiments of the invention with reference to the accompanying drawings in which:

FIG. 1 is a schematic diagram showing a semiconductor memory device in accordance with a first embodiment of the present invention;

FIG. 5 is a circuit diagram of the XOR basic unit circuit of FIG. 4;

FIG. 7 is a schematic diagram showing another construction of the XOR matrix circuit of FIG. 6;

FIG. 9 is a circuit diagram of an XOR basic unit circuit in a semiconductor memory device in accordance with a fourth embodiment of the present invention.

DETAILED DESCRIPTION OF THE PREFERRED EMBODIMENTS

Figure 2:
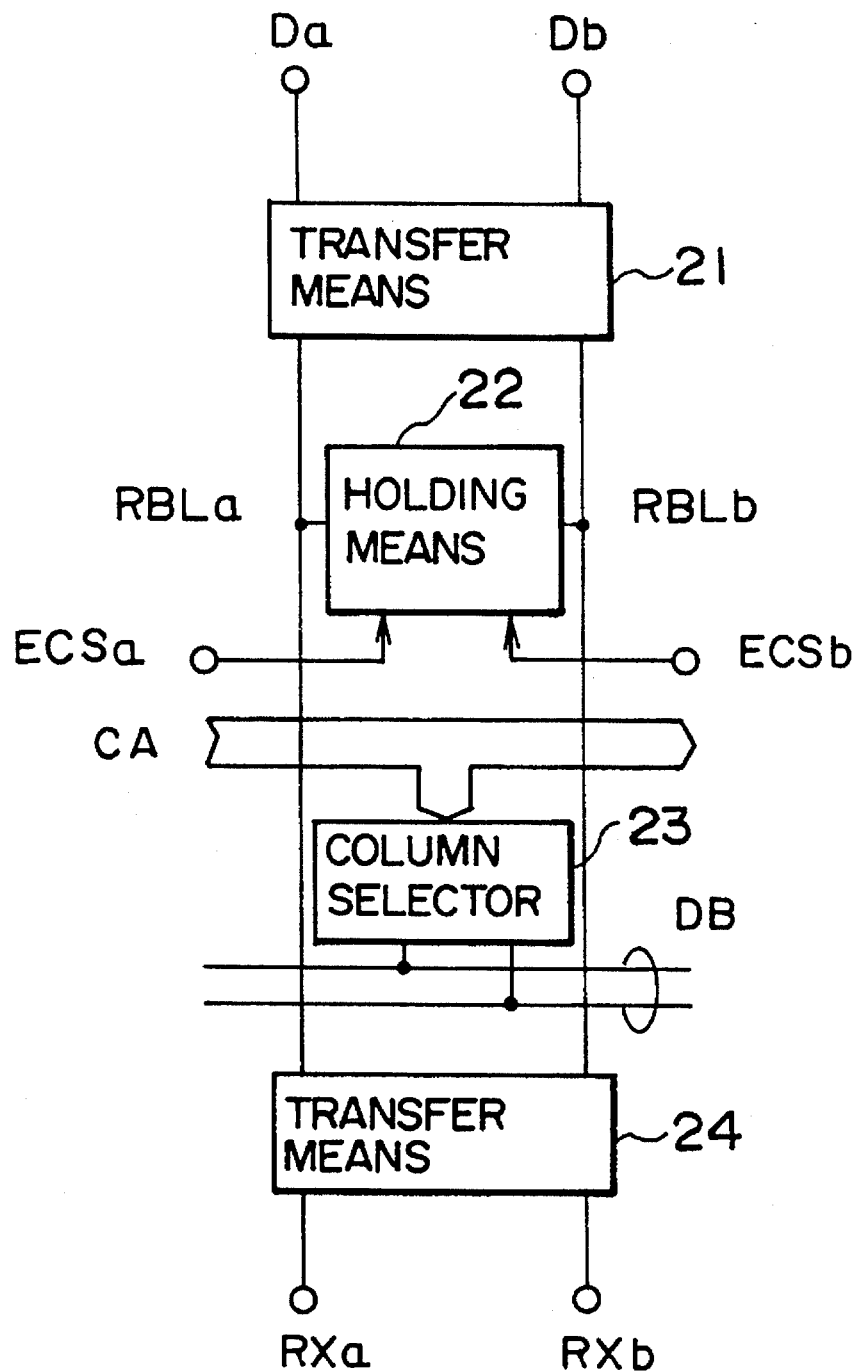
FIG. 2 is a block diagram showing a column register of FIG. 1.

With reference to a schematic diagram shown in FIG. 1, the first embodiment of the present invention will be described.

A semiconductor memory device shown in FIG. 1 comprises a memory cell array 10, a column register group 20, an XOR matrix circuit 30, and a syndrome decoder 40. Since the construction of the memory cell array 10, the column register group 20, and the syndrome decoder 40 is the same as that described in the above-mentioned documents 1 and 2, the construction will be briefly described.

(1) Memory Cell Array 10

The memory cell array 10 comprises an information bit region 10D and a parity bit region 10P. The information bit region 10D holds a plurality of information bits, whereas the parity bit region 10P holds a plurality of parity bits. The construction of these regions is the same. For simplicity, only the construction of the information bit region 10D will be described. Hereinafter, one set of data composed of a plurality of information bits and a plurality of parity bits is referred to as a data group. The information bit region 10D comprises a plurality of word lines $WL_0, WL_1, \ldots$, etc, and a plurality of complementary bit line pairs $BLD_a, BLD_b, \ldots$, etc. These word lines are intersected with the bit line pairs. At the intersections, memory cells $11_1, 11_2, \ldots$, etc. are disposed in a matrix shape. The complementary bit line pairs $BLD_a, BLD_b, \ldots$, etc. are connected to the column register group 20. Like the information bit region 10D, the parity bit region 10P comprises a plurality of word lines $WL_0, WL_1, \ldots$, etc. and a plurality of complementary bit line pairs $BLP_a, BLP_b, \ldots$, etc. The word lines $WL_0, WL_1, \ldots$, etc. are intersected with the complementary bit line pairs $BLP_a, BLP_b, \ldots$, etc.

It should be noted that the memory cell array 10 can have another construction like that disclosed in the above-mentioned documents 1 and 2. For example, the memory cells $11_1, 11_2, \ldots$, etc. are connected to a plurality of sub-bit line pairs. Sense amplifiers are connected to the sub-bit line pairs each other. The sub-bit line pairs are connected to main bit line pairs through switching means. The main bit line pairs are connected to the column register group 20.

The memory cell array 10 reads or writes information bits and parity bits which conduct data from or to each memory cell through the word lines and the complementary bit line pairs.

(2) Column Register Group 20

The column register group 20 comprises an information bit column register 20D and a parity bit column register 20P. The information bit column register 20D is connected to bit line pairs $BLD_a, BLD_b, \ldots$, etc. The information bit column registers 20D temporarily holds information bits. On the other hand, the parity bit column register 20P is connected to the bit line pairs $BLP_a, BLP_b, \ldots$, etc. The parity bit column register 20P temporarily holds parity bits. The column registers 20D and 20P are connected to a column address CA and an I/O bus DB. The construction of the information bit column register 20D is the same as that of the parity bit column register 20P. With reference to FIG. 2, the construction of only the information bit column register 20D will be described for simplicity.

FIG. 2 is a block diagram showing the construction of the information bit column register 20D.

The information bit column register 20D comprises bit line input terminals Da and Db which are connected to the bit line pairs $BLD_a, BLD_b, \ldots$, etc, correction signal input terminals $ECS_a$ and $ECS_b$ which are connected to a correction signal line pair $ECD_a$ and $ECD_b$, which are outputs of the syndrome decoder 40, and register output terminals $RX_a$ and $RX_b$ connected to a column input line pair $XGD_a$ and $XGD_b$ on the input side of the XOR matrix circuit 30.

The column register is provided with a transfer means 21 for transferring the logical value of each bit in two ways between the bit line input terminals Da and Db and a complementary register bit line pair $RBL_a$ and $RBL_b$. The register bit wire pair RBLa and RBLb are connected to a holding means 22 and a column selector 23. The holding means 22 holds the logical value of each bit. The holding means 22 is provided with an inverting means for inverting the logical value being held therein in accordance with signals of the correction signal input terminals $ECS_a$ and $ECS_b$ (for example, the logical value is inverted in the event that $ECS_a$="1" and $ECS_b$="0"). The column selector 23 is provided with a switching means which is controlled in accordance with a column address CA. The switching means is disposed between the register bit line pair $RBL_a$ and $RBL_b$ and the IO bus DB.

The register bit line pair $RBL_a$ and $RBL_b$ are connected to a transfer means 24 for transferring the logical value held in the holding means 22 to the register output terminals $RX_a$ and $RX_b$. The register output terminals $RX_a$ and $RX_b$ are connected to the XOR matrix circuit 30.

The construction of the parity bit column register 20P is the same as that of the information bit column register 20D except that bit line pairs are $BLP_a, BLP_b, \ldots$, etc, a correction signal input line pair on the output side of the syndrome decoder connected to the correction signal input terminals $ECS_a$ and $ECS_b$ are $ECP_a$ and $ECP_b$, and a column input line pair on the input side of the XOR matrix circuit 30 connected to the register output terminals $RX_a$ and $RX_b$ are $XGP_a$ and $XGP_b$.

(3) Syndrome Decoder 40

The syndrome decoder 40 comprises an information bit decoder 40D and a parity bit decoder 40P.

The information bit decoder 40D is provided with decode gates 41 in accordance with bits. Each decode gate 41 sends a correction signal to the information bit column register 20D which decoded a signal on the syndrome bus SB and where an error took place. The parity bit decoder 40P is provided with a decode gate 42 and a switching means 43. The construction of the decode gate 42 is the same as that of the decode gate 41. In the read mode, the switching means 43 sends the output of the decode gate 42 to the correction signal line pair $ECP_a$ and $ECP_b$ of the parity bit column register 20P. In the write mode, the switching means 43 sends the logical value of each bit of the signal on the syndrome bus SB to the correction signal line pair $ECP_a$ and $ECP_b$ as it is.

Next, the XOR matrix circuit 30 in accordance with the present invention will be described.

The XOR matrix circuit 30 comprises an information bit matrix region 30D and a parity bit matrix region 30P. The information bit matrix region 30D is connected to the information bit column register 20D. The parity bit matrix region 30P is connected to the parity bit column register 20P.

The XOR matrix circuit 30 receives the logical value of each bit of the column registers 20D and 20P and then calculates the parity of the input logical value. Thus, the XOR matrix circuit 30 outputs a syndrome in accordance with the input logical value to the syndrome decoder 40 through the syndrome bus SB. The XOR matrix circuit 30 comprises a plurality of XOR basic unit circuits (XORs). The XORs are disposed in accordance with the verifying matrix of error correction code. The XORs are cascade-connected so as to form parity circuits PTY. For instance, in the case of k-th bit, the output of the parity circuit $PTY_k$ is connected to the k-th bit $SB_k$ of the syndrome bus SB. Thus, a syndrome is obtained.

Figure 3:
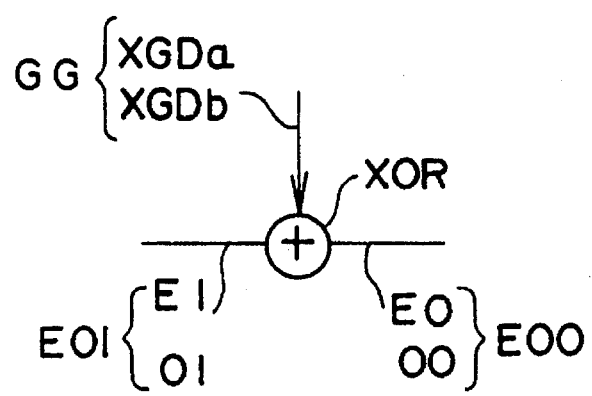
FIG. 3 is a symbolic diagram of an XOR basic unit circuit in the XOR matrix circuit of FIG. 1.
Figure 4:
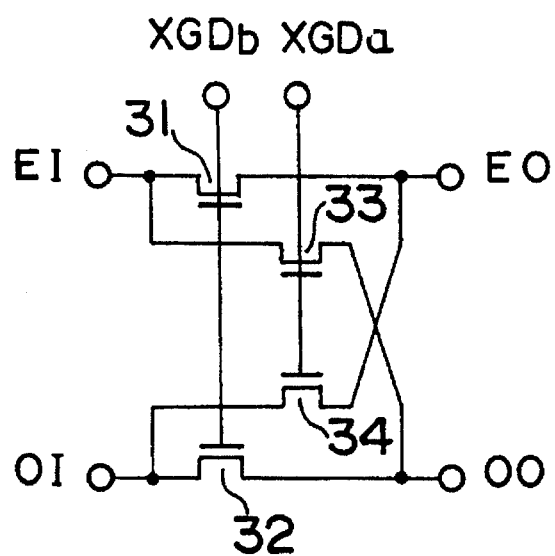
FIG. 4 is a circuit diagram of the XOR basic unit circuit in the XOR matrix circuit of FIG. 1.

FIG. 3 is a symbolic diagram of the XOR. FIG. 4 is a circuit diagram of the XOR. The construction of the XOR of the information bit matrix region 30D is the same as that of the parity bit matrix region 30P. Thus, for simplicity, only the construction of the information bit matrix region 30D will be described. In FIG. 3, the XOR comprises an even input terminal EI, an odd input terminal OI, an even output terminal EO, an odd output terminal OO, and complementary gate input terminals $XGD_a$ and $XGD_b$. These terminals are connected to N channel type MOS transistors (NMOS) 31 to 34.

The even input terminal EI is connected to each source of the NMOSs 31 and 33. The drain of the NMOS 31 is connected to the even output terminal EO. The drain of the NMOS 33 is connected to the odd output terminal OO. The odd input terminal OI is connected to each source of the NMOSs 32 and 34. The drain of the NMOS 32 is connected to the odd output terminal OO. The drain of the NMOS 34 is connected to the even output terminal EO. Each gate of the NMOSs 31 and 32 is commonly connected to the gate input terminal $XGD_b$. Each gate of the NMOSs 33 and 34 is commonly connected to the gate input terminal $XGD_a$.

For simplicity, the input line pair connected to the complementary gate input terminals $XGD_a$ and $XGD_b$ of each XOR are collectively referred to as a gate input line pair GG. In addition, the input line pair connected to the even input terminal EI and the odd input terminal OI are collectively referred to as an even/odd input line pair EOI. Moreover, the output line pair connected to the even output terminal EO and the odd output terminal OO are collectively referred to as an even/odd output line pair EOO.

FIG. 5 is a circuit diagram showing the XOR of FIG. 4.

In FIG. 5, DFF11, DFF12, DFF13, DFF21, DFF22, and DFF23 are diffused regions constructing sources and drains of the NMOSs 31 to 34. PL11 and PL12 are first polysilicon layers. PL41, PL42, and PL43 are fourth polysilicon layers. ML11, ML12, ML13, and ML14 are first metal layers. CH1 is an electrode connection of a first contact hole. CH2 is an electrode connection of a second contact hole. The X axis of the figure represents the direction in which the word lines $WL_0$, $WL_1$, ..., etc. run. On the other hand, the Y axis of the figure represents the direction in which the bit lines $BL_a$, $BL_b$, ..., etc. run.

Each gate of the NMOSs 31 and 32 is composed of the first polysilicon layer PL11. Each gate of the NMOSs 34 and 33 is composed of the first polysilicon layer PL12. The first polysilicon layers PL11 and PL12 are disposed in parallel with the Y axis. The NMOSs 31 and 32 are opposed to each other. The NMOSs 33 and 34 are opposed to each other.

The NMOSs 31 and 34 share the diffused region DFF11 as their drains. The diffused region DFF11 is connected to the first metal layer ML13 through the second contact hole CH2. The first metal layer ML13 is connected to the even output terminal EO. The NMOSs 32 and 33 share the diffused region DFF21 as their drains. The diffused region DFF21 is connected to the first metal layer ML14 through the second contact hole CH2. The first metal layer ML14 is connected to the odd output terminal OO.

The diffused region DFF12 which is the source of the NMOS 31 is connected to the diffused region DFF23 which is the source of the NMOS 33 with the first metal layer ML11 through the second contact hole CH2. The first metal layer ML11 is connected to the even input terminal EI through the second contact hole CH2. The diffused region DFF22 which is the source of the NMOS 32 is connected to the diffused region DFF13 which is the source of the NMOS 34 with the fourth polysilicon layer PL43 through the first contact hold CH1. The fourth polysilicon layer PL43 is connected to the first metal layer ML12 through the second contact hole CH2. The first metal layer ML12 is connected to the odd input terminal OI.

The fourth polysilicon layers PL41 and PL42 are disposed in parallel with the Y axis. Each of the first polysilicon layers PL11 and PL12 is provided with an electrode lead portion. The electrode lead portion of the first polysilicon layer PL11 is connected to the fourth polysilicon layer PL41 through the first contact hole CH1. The electrode lead portion of the first polysilicon layer PL12 is connected to the fourth polysilicon layer PL42 through the first contact hole CH1. The fourth polysilicon layer PL41 is connected to the gate input terminal $XGD_b$. The fourth polysilicon layer PL42 is connected to the gate input terminal $XGD_a$. The construction of the XOR of the parity bit matrix region 30P is the same as that of the information bit matrix region 30D except that the complementary gate input terminals which are the column input line pair on the input side of the XOR matrix circuit 30 are $XGP_a$ and $XGP_b$.

Next, the relationship between the XOR matrix circuit 30 and the verifying matrix H will be described.

The verifying matrix H of SEC code is represented with SEC (M, M+K) code where the number of information bits of a data group is M and the number of parity bits thereof is K. Thus, the verifying matrix H is composed of K rows and (M+K) columns. Each element of the matrix is "1" or "0". The relation between the SEC (M, M+K) code and the XOR matrix circuit 30 is as follows.

As shown in FIG. 1, a column input wire pair $XJ_m a$ and $XJ_m b$ (where m=1 to M and which include column input lines $XGD_a$, $XGD_b$, $XGP_a$, and $XGP_b$) (for instance of the m-th column) of the XOR matrix circuit 30 which run in the direction of the bit line pairs $BL_a$, $BL_b$, ..., etc. accord with the columns of the verifying matrix H. At intersections of the column input line pair $XJ_m a$ and $XJ_m b$ with the rows of the verifying matrix H, wiring channels $ch_k$ (where k=1 to K) are disposed.

In this relation, at positions of elements with "1" of the verifying matrix H, XORs are disposed. At the $XOR_{im}$ (where i=1 to k) disposed at m columns, the gate input line pair GG are commonly connected to the column input line pair $XJ_m a$ and $XJ_m b$ at the m-th column. At the $XOR_{kj}$ (where j=1 to M) disposed at k rows, the even/odd output line pair EOO are cascade-connected to the even/odd input line pair EOI of the next stage XOR of the same row. Thus, parity circuits $PTY_k$ (where k=1 to K) are formed. The outputs of these parity circuits $PTY_k$ are connected to $SB_k$ of the k-th bit of the syndrome bus SB. As a result, a syndrome is obtained.

In the information bit matrix region 30D of the XOR matrix circuit 30 in accordance with the present invention, the above-mentioned first XORs 1 are disposed. The positions of the first XORs 1 accord with a minor matrix H0 as represented by the following formula (1).

$$H=[H_0 \vdots I] \quad (1)$$

where H is the verifying matrix; I is a unit matrix; and H0 is a minor matrix which is a pan of the unit matrix I.

In the information bit matrix region 30D, the gate input line pair GG of the XORs $1_{im}$ (where i=1 to K) disposed at m columns (where m=1 to M) are commonly connected to the column input lines $XGD_m a$ and $XGD_m b$ thereof. The XORs $1_{kj}$ (where j=1 to M) disposed at k rows (where k=1 to K) are cascade-connected in the row direction. Thus, parity circuits $PTY1_k$ are formed.

On the other hand, in the parity bit matrix circuit 30P, second $XOR2_k$ are disposed. The positions of the second $XOR2_k$ accord with a unit matrix I of the verifying matrix H represented by the following formula (2).

$$H=[H_0 \vdots I] \quad (2)$$

The second XORs $2_k$ are disposed so that the control electrodes of the constructional transistors thereof are in parallel with the word lines $WL_0$, $WL_1$, ..., etc. of the memory cell array 10. In other words, the second XORs $2_k$ are disposed by rotating the XOR pattern shown in FIG. 4 by 90° against the first XORs 1. More specifically, the gates of the NMOSs 31 to 34 which construct the second XOR $2_k$ shown in FIG. 4 are disposed substantially perpendicular to the gates thereof which construct the first XOR 1.

In the second XORs $2_k$ which are disposed at k rows and k columns, the gate input line pair GG are connected to the output side of the parity circuits $PTY1_k$. The even/odd input line pair EOI are connected to the column input line pair $XGP_k a$ and $XGP_k b$ (where k=1 to K) of the parity bit matrix region 130P. The even/odd output line pair EOO are extended and connected to corresponding signal lines of the syndrome bus SB of the syndrome decoder 40. Thus, according to the present invention, the output of the XOR matrix circuit 30 is connected to the syndrome bus SB of the syndrome decoder 40 by extending the even/odd output line pair EOO of each second XOR $2_k$ of the parity bit matrix region 30P. As a result, the density of the integration of the apparatus can be improved without excessive rerouting and connections of lines.

Next, the operation of the semiconductor memory device with built-in ECC of FIG. 1 according to the present invention will be described

Read Operation

The logical values of a data group held in the memory cell array 10 are read at a time. The logical values are temporarily held in the column register group 20. In addition, the logical values are transferred to the XOR matrix circuit 30. Thus, information bits and parity bits are sent to the column wire pair $XGD_a$ and $XGD_b$ and the column wire pair $XGP_a$ and $XGP_b$, respectively. Next, the XOR matrix circuit 30 performs a parity calculation. Then, a syndrome signal in accordance with an error of the data group is sent to the syndrome bus SB. When the syndrome signal of the syndrome bus SB is sent to the syndrome decoder 40, the syndrome decoder 40 decodes the syndrome signal and detects a defective bit. In accordance with the detection result, the error of the column register group 20 is corrected.

For example, if an error takes place in an information bit, only the corresponding decode gate 41 of the information bit decoder 40D is activated. Thus, the correction signal line pair $ECD_a$ and $ECD_b$ are activated and the content of the corresponding information bit column register $20D_m$ is inverted. As a result, the error is corrected. If an error takes place in a parity bit, only the corresponding decode gate 42 of the parity bit decoder 40P is activated. In the read mode, the switching means 43 causes the output of the decode gate 42 to be sent to the correction signal line pair $ECP_a$ and $ECP_b$. Thus, the content of the corresponding parity bit column register $20P_k$ is inverted. As a result, the error of the parity bit is corrected. Thereafter, the logical value of the information bit column register $20D_m$ designated with the column address CA is sent to the I/O bus DB and the read operation is completed.

Write Operation

Before the execution of the write operation, the read operation is performed so as to correct a defective bit. Thereafter, the logical value of write data is sent to the I/O bus DB. The content of the information bit column register $20D_m$ designated with the column address CA is updated. At this point, the content of the parity bit column register $20P_k$ is not updated.

Then, the logical value of each bit of the column register group 20 is sent to the XOR matrix circuit 30. The XOR matrix circuit 30 performs a parity calculation. The calculation result is sent to the syndrome bus SB. The logical value SYBSi of each bit of the syndrome bus SB is obtained by exclusive-ORing a logical value $PY_{OLDi}$ of a parity bit according to an information bit before updating and a logical value $PY_{NEWi}$ of a parity bit according to an information bit after updating. In other words, the logical value SYBSi can be obtained by the following formula (3).

$$SYBS_i = PY_{OLDi} \oplus PY_{NEWi} \quad (3)$$

The result is sent to the syndrome decoder 40.

In the write mode, the information bit decoder 40D is deactivated. In the parity bit decoder 40P, the switching means 43 causes the logical value of each bit of the syndrome bus SB to be sent to the correction signal line pair $ECP_a$ and $ECP_b$ of the parity bit column register $20P_k$. Thus, in the parity bit column register $20P_k$, the logical value of a relevant bit which satisfies the following formula (4) is inverted. Thus, the logical value of the parity bit according to the information bit after updating can be obtained.

$$P\,Y_{OLDi} \oplus P\,Y_{NEWi} = \text{"1"} \tag{4}$$

When the data group held in the column register group 20 is updated, the logical values of the data group are written to the memory cell array 10 at a time and then the write operation is completed.

Next, with reference to FIG. 6, a second embodiment of the present invention will be described.

The feature of the second embodiment is in that N information bits of a data group is divided into a first information bit group A of N1 bits and a second information bit group B of N2 bits (N1+N2=M). Thus, the column register, the XOR matrix circuit, and the syndrome decoder are constructed in accordance with the first group A and the second group B. The column register according to a parity bit is placed between the column registers according to an information bit. The XOR matrix circuit according to a parity bit is placed between the XOR matrix circuits according to an information bit. The syndrome decoder according to a parity bit is placed between the syndrome decoders according to an information bit.

Column Register Group 120

The column register group 120 comprises a first information bit column register group 120A, a second information bit column register group 120B, and a parity bit column register group 120P. The first information bit column register group 120A temporarily holds the first information bit group A. The second information bit column register group 120B temporarily holds the second information bit group B. The parity bit column register group 120P temporarily holds parity bits. The first information bit column register group 120A comprises a plurality of information bit column registers $120A_m$ connected to the bit line pair $BLA_a$ and $BLA_b$. The second information bit column register group 120B comprises a plurality of information bit column registers $120B_j$ connected to the bit line pair $BLB_a$ and $BLB_b$. The parity bit column register group 120P comprises a plurality of parity bit column registers $120P_k$ connected to the bit line pair $BLP_a$ and $BLP_b$. The construction of the information bit column registers $120A_m$ and $120B_j$ is the same as that of the information bit column register 20D of the first embodiment. In addition, the construction of the parity bit column registers $P_k$ is the same as that of the parity bit column register 20P of the first embodiment. However, the information bit column register $120A_m$ is connected to the column input line pair $XGA_{ja}$ and $XGA_{jb}$ of the XOR matrix circuit. The information bit column register $120B_j$ is connected to the column input line pair $XGB_{ja}$ and $XGB_{jb}$. The parity bit column register $120P_k$ is connected to the column input line pair $XGP_{ka}$ and $XGP_{kb}$.

XOR Matrix Circuit 130

The XOR matrix circuit 130 comprises a first information bit matrix region 130A according to the first information bit group A, a second information bit matrix region 130B according to the second information bit group B, and a parity bit matrix region 130P. The regions 130A, 130B, and 130P can be represented with the following formula (5).

$$H = [H1 : H2 : I] \tag{5}$$

where H is a verifying matrix; H1 is a minor matrix of K rows and N1 columns; and H2 is a minor matrix of K rows and N2 columns, and I is a unit matrix.

In this formula, the first information bit matrix region 130A accords with the minor matrix H1; the second information bit matrix region 130B accords with the minor matrix H2; and the parity bit matrix region 130P accords with the unit matrix I. In the first information bit matrix region, the column input line pair $XGA_{ja}$ and $XGA_{jb}$ are connected to the output terminals $RX_a$ and $RX_b$ of the information bit column register $120A_m$. The column input line pair $XGA_{ja}$ and $XGA_{jb}$ are disposed in accordance with each column of the minor matrix H1. The first information bit matrix region 130A comprises a plurality of first XORs 1A. The first XORs 1A are disposed in accordance with the minor matrix H1 in the same manner as the first embodiment. The first XORs 1A are cascade-connected so as to form a parity circuit $PTYA_k$ (where k=1 to K) for each row. The output line pair $PCA_k a$ and $PCA_k b$ (where k=1 to K) of each parity circuit $PTYA_k$ are connected to the input side of the parity bit matrix region 130P. Likewise, in the second information bit matrix region 130B, the column input line pair $XGB_{ja}$ and $XGB_{jb}$ are disposed in accordance with each column of the minor matrix H2. A plurality of second XORs 1B are disposed in accordance with the minor matrix H2. The second XORs 1B are cascade-connected so as to form a parity circuit $PTYB_k$ for each column of the minor matrix H2. The output wire pair $PCB_{ka}$ and $PCB_{kb}$ (where k=1 to K) of each parity circuit $PTYB_k$ are connected to the input side of the parity bit matrix region 130P. Thus, the direction of signal flow in each parity circuit $PTYA_k$ of the first information bit matrix region 130A is the inverse of that in each parity circuit $PTYB_k$ of the second information bit matrix region 13B.

In the parity bit matrix region 130P, the second XOR $121_k$ and XOR $122_k$ are disposed in accordance with the unit matrix I. Each matrix element with "1" of the unit matrix accords with the two XOR $121_k$ and XOR $122_k$. The gate input line pair GG1 of the XOR $121_k$ are connected to the output line pair $PCA_k a$ and $PCA_k b$ of the parity circuit $PTYA_k$ disposed at the k-th row of the first information bit matrix region 130A. The gate input line pair GG2 of the XOR $122_k$ are connected to the output line pair $PCB_k a$ and $PCB_k b$ of the parity circuit $PTYB_k$ disposed at the k-th row of the second information bit matrix region 130B. The odd/even input line pair EOI1 of the XOR $121_k$ are connected to the output terminals $RX_a$ and $RX_b$ of the parity bit column register $120P_k$. The even/odd output line pair EOO1 are cascade-connected to the even/odd input line pair EOI2 of the XOR $122_k$. The even/odd output line pair EOO2 of the XOR $122_k$ are extended and connected to the syndrome bus SB of the syndrome decoder 140.

Next, the operation of the XOR matrix circuit 130 will be described.

First, the logical value of each bit of the first information bit group A of the first information bit column register group 120A is transferred to the first information bit matrix region 130A. The parity circuit $PTYA_k$ (where k=1 to K) of each row perform a parity calculation for the logical value of each bit and sends a first calculation result to the output line pair $PCA_k a$ and $PCA_k b$. In addition, the logical value of each bit of the second information bit group B of the second information bit column register group 120B is transferred to the second information bit matrix region 130B. The parity circuit $PTYB_k$ (where k=1 to K) for each row performs a parity calculation for the logical value of each bit and sends a second calculation result to the output line pair $PCB_k a$ and $PCB_k b$ (where k=1 to K). In the parity bit matrix region 130P, a parity calculation for the first calculation result and the second calculation result are performed in accordance with the following formula (6). Thus, a syndrome can be obtained.

$$SYBS_k = PCA_k a \oplus PCB_k a \oplus P_k \qquad (6)$$

where Pk is the logical value of the k-th parity bit.

On the other hand, a syndrome obtained by the conventional circuit can be represented with a K-th order column vector SY using the following formula (7).

$$SY = H \cdot \begin{bmatrix} v1 \\ v2 \\ PY \end{bmatrix} = [H1 \vdots H2 \vdots I] \cdot \begin{bmatrix} v1 \\ v2 \\ PY \end{bmatrix} \qquad (7)$$

$$= H1v1 \oplus H2v2 \oplus PY$$

where v1 is a N1-th order column vector representing the logical value of each bit of the first information bit group A; v2 is an N2-th order column vector representing the logical value of each bit of the second information bit group B; and PY is a K-th order column vector representing parity bits. The formula (7) is a vector notation of each term of the formula (6). Thus, in the circuit according to this embodiment, the predetermined syndrome can be obtained.

According to the second embodiment, the following effect can be obtained.

The parity bit matrix region 130P accords with the unit matrix. In the unit matrix, only one matrix element of each row and each column is "1". Thus, even if two XORs are successively disposed in the column direction in accordance with each matrix element, no circuits are disposed on the preceding and following rows. Therefore, a sufficient wiring region which detours the output line pair of the parity circuit disposed at the adjacent row {(k+1)-th row} is present. As a result, the region of the circuit does not increase in the column direction at all.

Figure 6:
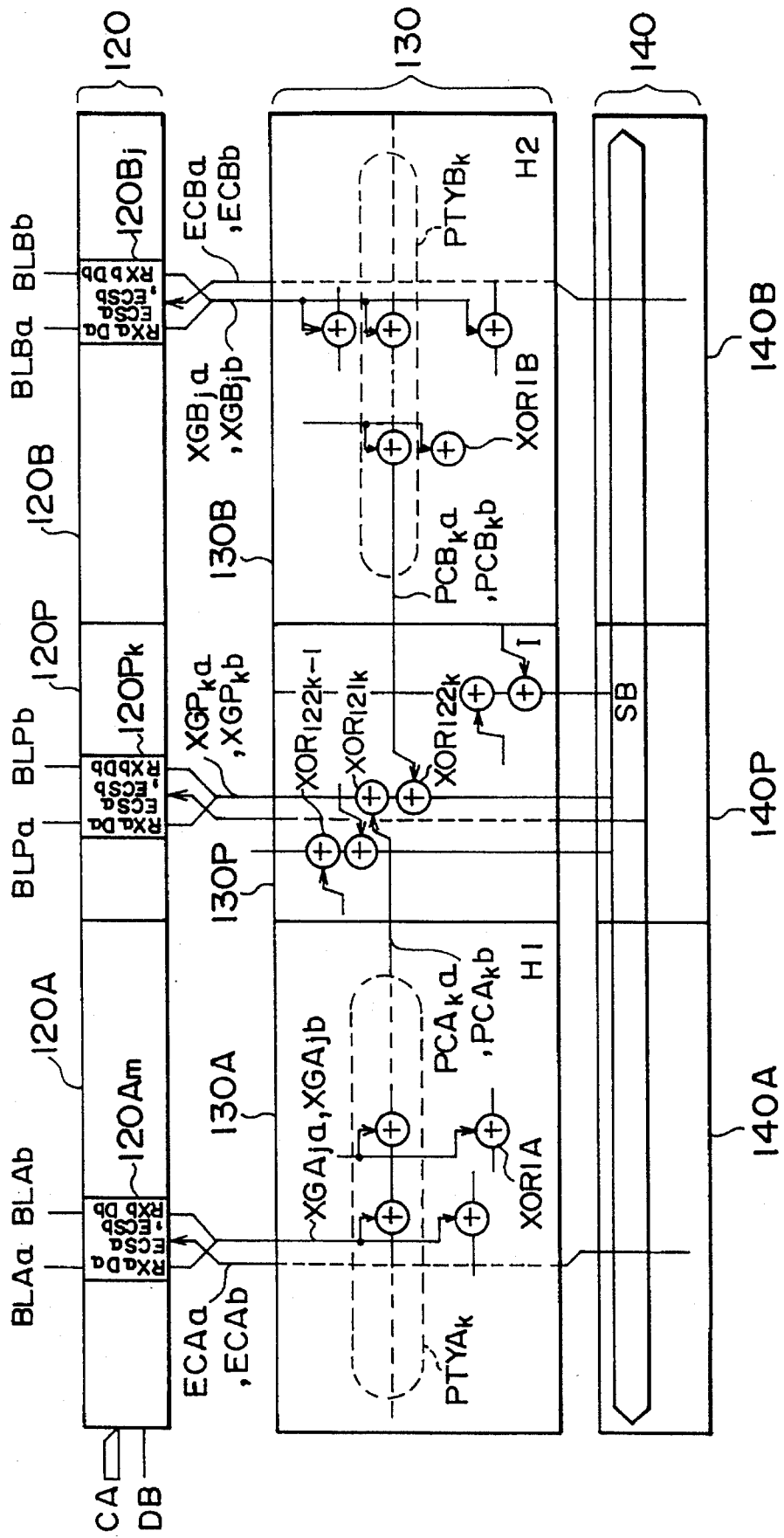
FIG. 6 is a schematic diagram of a semiconductor memory device in accordance with a second embodiment of the present invention.

In addition, as shown in FIG. 6, one XOR (XOR $121_k$) of XORs according to matrix elements of k rows and k columns of the unit matrix I and one XOR (XOR $122_{k-1}$) of XORs according to matrix elements of (k+1) rows and (k+1) columns are successively disposed on the same row. Thus, in the parity bit matrix region 130P, the pitch of each column input line pair should be the same as the pitch of XORs. Therefore, the circuit region increases in the row direction. However, since the number of parity bits is a friction of the number of information bits, the area of the XOR matrix circuit does not remarkably increase. For example, when the number of information bits is 128, the number of stages of the conventional matrix H is 64. When the order number N1 is equal to N2, the number of stages of each of the minor matrix H1 and the minor matrix H2 is 32. Thus, the number of circuit stages of the parity circuits $PTYA_k$ and $PTYB_k$ including the parity bit matrix region 130P and the syndrome bus SB becomes 34 which is much smaller than 65 stages of the conventional apparatus. As a result, according to this embodiment, the number of stages can decrease to the half of that of the conventional apparatus without remarkable increase of the circuit area. In addition, according to this embodiment, the semiconductor memory device which operates at a high speed can be obtained.

Moreover, by using the parity circuit $PTYA_k$ and $PTYB_k$ of the first and second information matrix regions 130A and 130B in the "Double Tier XOR Scheme" construction disclosed in the above-mentioned documents 1 and 2, a much faster semiconductor memory device than the above-mentioned device can be obtained. In the case where the number of information bits is 128, when each of the parity circuits $PTYA_k$ and $PTYB_k$ of the first and second information bit matrix regions 230A and 230B comprises four 8-input parity circuits P1 and a 4-input parity circuit P2 which receives outputs of the parity circuits P1, the number of circuit stages of the XOR matrix circuit becomes 14 which is smaller than 17 stages of the conventional device. In addition, the stray capacitance of the wires of the parity circuits PTYAk and PTYBk is the half that of the parity circuit of each row of the conventional XOR matrix circuit. As a result, a much faster semiconductor memory device than the conventional device can be obtained.

It should be noted that the XOR matrix circuit according to the second embodiment can be constructed as shown in FIG. 7. FIG. 7 shows portions in the vicinity of the XOR disposed at the k-th row and k-th column of the parity bit matrix region 130P.

In FIG. 7, $PCA_k a$ and $PCA_k b$ are an output line pair of the parity circuit $PTYA_k$ disposed at the k-th row of the first information bit matrix region 130A. $PCA_{k+1} a$ and $PCA_{k+1} b$ are an output line pair of the parity circuit $PTYA_{k+1}$ disposed at the (k+1)-th row of the first information bit matrix region 130A. $PCB_k a$ and $PCB_k b$ are an output line pair disposed at the k-th row of the second information bit matrix region 130B. $PCB_{k+1} a$ and $PCB_{k+1} b$ are an output line pair of the parity circuit $PTYB_{k+1}$ disposed at the (k+1)-th row of the second information bit matrix region 130B.

XOR $221_k$ and XOR $222_k$ according to the element at the k-th row and k-th column of the unit matrix I are provided. In addition, XOR $221_{k+1}$ and XOR $222_{k+1}$ according to the element at the (k+1)-th row and (k+1)-th column of the unit matrix I are disposed. A signal line pair $P_k a$ and $P_k b$ accord with the k-th parity bit. A signal line pair $P_{k+1} a$ and $P_{k+1} b$ accord with the (k+1)-th parity bit. A signal line pair $SB_k a$ and $SB_k b$ accord with the k-th syndrome bit. A signal line pair $SB_{k+1} a$ and $SB_{k+1} b$ accord with the (k+1)-th syndrome bit.

The operation of the XOR matrix circuit shown in FIG. 7 is the same as that shown in FIG. 6. However, the direction of the XOR $221_k$ and XOR $222_k$ disposed in the parity matrix region 130P is the same as that of each XOR disposed in the information bit matrix regions 130A and 130B. The XORs $221_k$, $221_{k+1}$, $222_k$, and $222_{k+1}$ are disposed at four adjacent grid points at the k-th and (k+1)-th rows and the k-th and (k+1)-th columns.

Thus, since only two matrix elements according to the adjacent four grid points are "1", the circuit area of FIG. 7 is not remarkably larger than that of FIG. 6. The XOR matrix circuit of FIG. 7 can be also applied to the XORs of the information bit matrix region. In addition to the second embodiment, the XOR matrix circuit of FIG. 7 can be satisfactorily applied to the conventional semiconductor memory device with built-in ECC.

Next, with reference to FIG. 8, a third embodiment of the present invention will be described.

The feature of the third embodiment is in that an XOR matrix circuit is constructed in accordance with the property of a matrix. First, the property of the matrix in accordance with the third embodiment will be described.

A column vector $v_r$ and its transposed column vector $^t v^r$ is given by the following formula (8). The column vector $v^r$ is obtained by cyclically shifting each element of the N-th order two-dimensional column vector v by r bits in a first direction (for example, in the upper direction).

$$^t v = (v_1, v_2, v_3, \ldots, v_N)$$

$$^t v^r = (v_{r+1}, v_{r+2}, \ldots, v_N, v_1, v_2, \ldots, v_r) \tag{8}$$

where t: transposed

In the case $r<0$, when the column vector $v^r$ is cyclically shifted in a second direction (for example, in the lower direction), the following formula (9) can be obtained.

$$v^0 = v$$

$$(v^r)^{-r} = v \tag{9}$$

A matrix $P^r$ obtained by cyclically shifting each column vector p constructing a matrix P of k rows and N columns by r bits can be represented by the following formula (10).

$$P = [p_1 \ p_2 \ \ldots \ p_N]$$

$$P^r = [p_1^r \ p_2^r \ \ldots \ p_N^r] \tag{10}$$

In the above-mentioned definition, the following formula (11) can be obtained.

$$I^r v = v^r \tag{11}$$

where I is a unit matrix.

Next, when a product Pv is z, z is an N-th order column vector. The elements of the vector is given by the following formula (12).

$$z = Pv = \begin{bmatrix} p_{11} & p_{12} & \cdots & p_{1N} \\ \cdot & \cdot & & \cdot \\ \cdot & \cdot & & \cdot \\ p_{r1} & p_{r2} & \cdots & p_{rN} \\ \cdot & \cdot & & \cdot \\ \cdot & \cdot & & \cdot \\ p_{k1} & p_{k2} & \cdots & p_{kN} \end{bmatrix} \begin{bmatrix} v_1 \\ \cdot \\ \cdot \\ v_r \\ \cdot \\ \cdot \\ v_N \end{bmatrix} \tag{12}$$

$$= \begin{bmatrix} p_{11}v_1 \oplus p_{12}v_2 \oplus \ldots \oplus p_{1N}v_N \\ \cdot \\ \cdot \\ p_{r1}v_1 \oplus p_{r2}v_2 \oplus \ldots \oplus p_{rN}v_N \\ \cdot \\ \cdot \\ p_{k1}v_1 \oplus p_{k2}v_2 \oplus \ldots \oplus p_{kN}v_N \end{bmatrix}$$

When a product $P^r v$ is z1, z1 is given by the following formula (13).

$$z1 = P^r v = \begin{bmatrix} p_{(r+1)1} & p_{(r+1)2} & \cdots & p_{(r+1)N} \\ p_{(r+2)1} & p_{(r+2)2} & \cdots & p_{(r+2)N} \\ \cdot & \cdot & & \cdot \\ \cdot & \cdot & & \cdot \\ p_{11} & p_{12} & \cdots & p_{1N} \\ \cdot & \cdot & & \cdot \\ \cdot & \cdot & & \cdot \\ p_{r1} & p_{r2} & \cdots & p_{rN} \end{bmatrix} \begin{bmatrix} v_1 \\ \cdot \\ \cdot \\ v_r \\ \cdot \\ \cdot \\ v_N \end{bmatrix} \tag{13}$$

$$= \begin{bmatrix} p_{(r+1)1}v_1 \oplus p_{(r+1)2}v_2 \oplus \ldots \oplus p_{(r+1)N}v_N \\ p_{(r+2)1}v_1 \oplus p_{(r+2)2}v_2 \oplus \ldots \oplus p_{(r+2)N}v_N \\ \cdot \\ \cdot \\ p_{11}v_1 \oplus p_{12}v_2 \oplus \ldots \oplus p_{1N}v_N \\ \cdot \\ \cdot \\ p_{r1}v_1 \oplus p_{r2}v_2 \oplus \ldots \oplus p_{rN}v_N \end{bmatrix}$$

When each element of the formula (12) is compared with each element of the formula (13), the column vector z1 is obtained by cyclically shifting each element of the column vector z by r bits in accordance with the following formula (14).

$$z1 = z^r \tag{14}$$

Thus, by using the formulas (12) to (14), the following formula (15) can be obtained.

$$P^r v = (Pv)^r = z^r \tag{15}$$

In addition, by the formulas (9) and (11), the following formula (16) can be obtained.

$$I^{-r} z^r = (z^r)^{-r} = z \tag{16}$$

Thus, by using the formulas (12), (15), and (16), the following formula (17) can be obtained.

$$I^{-r}(P^r v) = Pv \tag{17}$$

Next, a syndrome calculating formula in accordance with the third embodiment will be described. Like the second embodiment, a data group of the third embodiment is composed of a first information bit group A of N1 bits, a second information bit group B of N2 bits, and K parity bits. The logical value of each bit of the information bit group A is represented with a column vector v1. The logical value of each bit of the information bit group B is represented with a column vector v2. A verifying matrix H is given by the above-mentioned formula (5).

$$H = [H1 \ \vdots \ H2 \ \vdots \ I] \tag{5}$$

As described earlier, the logical value of each bit of a syndrome is represented with a K-th order column vector SY. The logical value of each parity bit is represented with a K-th order column vector PY. Thus, the formula (7) is given.

$$SY = H1 \cdot v1 \oplus H2 \cdot v2 \oplus PY \tag{7}$$

The formula (7) can be modified to the following formula (18) using the formula (17).

$$SY = 1 \cdot (H1 \cdot v1) \oplus I^{-r} \cdot (H2^r \cdot v2) \oplus PY \tag{18}$$

Figure 8:
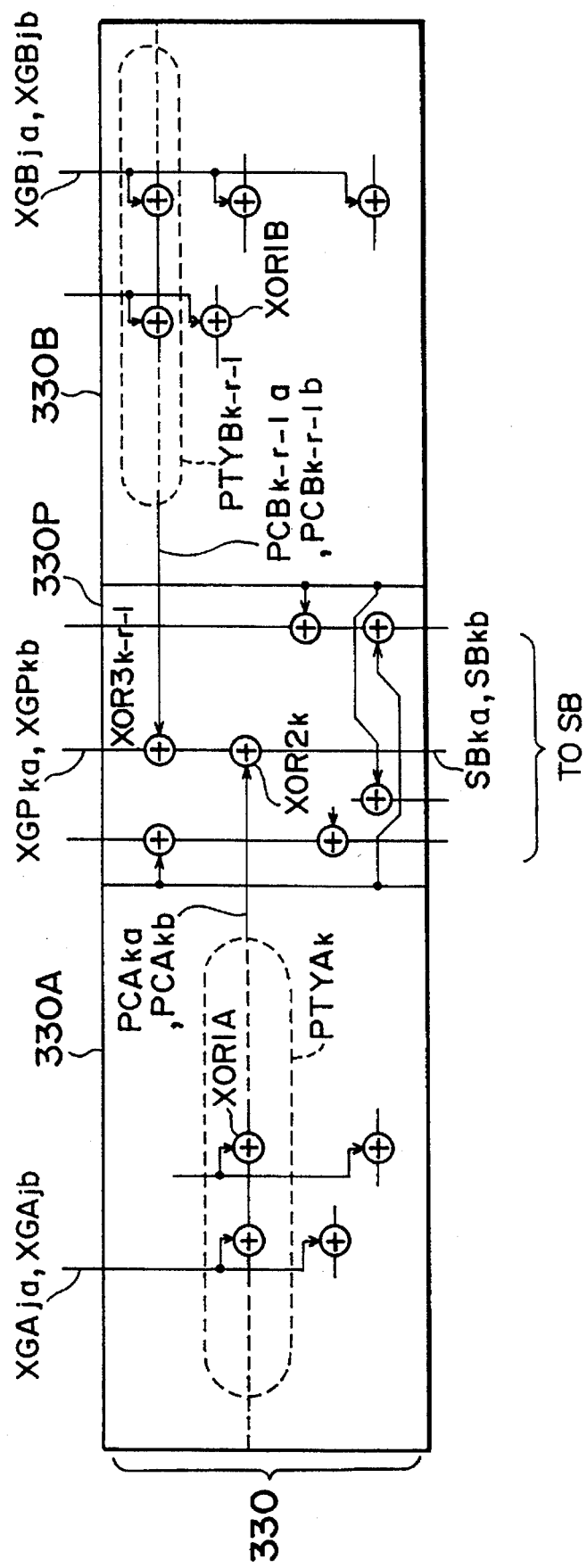
FIG. 8 is a schematic diagram showing a construction of an XOR matrix circuit in accordance with a third embodiment of the present invention.

In accordance with the formula (18), an XOR matrix circuit 330 of FIG. 8 is constructed. The XOR matrix circuit 330 shown in FIG. 8 comprises a first information bit matrix region 330A according to the first information bit group A, a second information bit matrix region 330B according to the second information bit group B, and a parity bit matrix region 330P. In the first information bit matrix region 330A, first XORs 1A are disposed and wired in accordance with the matrix H1 of the formula (18). The relation between the first XORs 1A and the matrix H1 is the same as that of the second embodiment. By the first XORs 1A, a parity circuit PTYA$_k$ (where k=1 to K) is constructed for each row. An output line pair PCA$_k$a and PCA$_k$b (where k=1 to K) of each parity circuit PTYA$_k$ are connected to the input side of the matrix region 330P.

In the second information bit matrix region 330B, first XORs 1B are disposed and wired in accordance with the matrix H2$^r$ of the formula (18). By the first XORs 1B, a parity circuit PTYB$_k$ (where k=1 to K) is constructed for each row. An output line pair PCB$_k$a and PCB$_k$b (where k=1 to K) of each parity circuit PTYB$_k$ are connected to the input side of the parity bit matrix region 330P. When the logical value of each bit of the output line pair PCB$_k$a and PCB$_k$b is represented with a column vector y, the following formula (19) can be obtained.

$$y = H2^r \cdot v2 \tag{19}$$

The direction of signal flow in each parity circuit PTYB$_k$ of the second information bit matrix region 330B is the inverse of that in each parity circuit PTYA$_k$ of the first information bit matrix region 330A.

In the parity bit matrix region 330P, second XORs 2$_k$ are disposed in accordance with matrix elements (for instance, of k rows and k columns) with "1" of the unit matrix I of the formula (18). In addition, third XORs 3$_{k-r-1}$ are disposed in accordance with matrix elements (for instance, of (k–r–1) rows and k columns and where k–r is a calculation of mod K) with "1" of the unit matrix I$^{-r}$ of the formula (18). The construction of the second XORs 2$_k$ is the same as that of the third XORs 3$_{k-r-1}$ except for that their connections differ from each other.

Next, the connections of each circuit in the parity bit matrix region 330P will be described. In each of the second XORs 2$_k$ disposed at k rows and k columns, a gate input line pair GG1 are connected to the output line pair PCA$_k$a and PCA$_k$b of the parity circuit PTYA$_k$ disposed at the k-th row of the first information bit matrix region 330A. In each of the third XORs 3$_{k-r-1}$, a gate input line pair GG2 are connected to the output line pair PCB$_{k-r-1}$a and PCB$_{k-r-1}$b of the parity circuit PTYB$_{k-r-1}$ disposed at the (k–r–1)-th row of the parity bit matrix region 330P. The (k–r–1) represents a calculation of mod K. The second XORs 2$_k$ and the third XORs 3$_{k-r-1}$ are cascade-connected, one even/odd input line pair thereof being connected to the column input line pair XGP$_k$a and XGP$_k$b at the k-th bit of the parity bit matrix region 330P, the other even/odd output line pair being extended and connected to the signal line pair SBka and SB$_k$b at the k-th bit of the syndrome bus SB.

Next, the operation of the XOR matrix circuit of FIG. 8 will be described.

Like the second embodiment, the logical value of each bit of the information bit column registers 20A$_m$ and 20B$_j$ of FIG. 6 is transferred to the column input line pair XGA$_j$a and XGA$_j$b of the first information matrix region 330A and the column input line pair XGB$_j$a and XGB$_j$b of the second information bit matrix region 330B. In each of the regions 330A and 330B, a parity calculation is performed. The first calculation result of each row of the first information bit matrix region 330A is sent to the output line pair PCA$_k$a and PCA$_k$b. The second calculation result of each row of the second information bit matrix region 330B is sent to the output line pair PCB$_k$a and PCB$_k$b. Thus, in the parity bit matrix region 330P, the first and second calculation results and the parity bits are parity-calculated and thereby a syndrome is obtained.

The logical value SY$_k$ at the k-th bit of the syndrome can be given by the following formula (20) in accordance with the circuit construction.

$$SY_k = PCA_k a \oplus PCB_{k-r-1} a \oplus PY_k \tag{20}$$

The transposed vector $^t x$ of the column vector x is given by the following formula.

$$\begin{aligned} t_l &= (PCB_{k-r-1}a, PCB_{k-r}a, \ldots, \\ &\quad PCB_1 a, PCB_2 a, \ldots, PCB_{k-r}a) \\ &= (x_{k-r-1}, x_{k-r}, \ldots, x_1, x_2, \ldots, x_{k-r}) \end{aligned} \tag{21}$$

By using the formula (11), the following formula (22) is obtained.

$$x = I^{-r} y \tag{22}$$

By using the formula (19), the following formula (23) can be obtained.

$$x = I^{-r} \cdot (H2^r \cdot v2) \tag{23}$$

In other words, the formula (18) is a vector notation of the formula (20). Thus, the formula (18) is equivalent to the formula (7). As a result, the predetermined syndrome can be obtained.

When the XOR matrix circuit is constructed in the above-mentioned manner, XORs are disposed in accordance with matrix elements with "1" of the matrix I+I$^{-r}$. Thus, when the value of r is properly selected, XORs are not adjacently disposed at grid points in both column and row directions. Therefore, at least two sets of column input line pair XGP$_k$a and XGP$_k$b can be disposed in accordance with one XOR. Like the first and second information bit matrix regions 330A and 330B, the pitch of the column input line pair XGP$_k$a and XGP$_k$b can be decreased. Thus, the circuit area can be decreased than the conventional apparatus. As a result, the density of integration of the XOR circuit can be easily increased.

In addition, like the second embodiment, the number of stages of the parity circuits PTYA$_k$ and PTYA$_{k-r-1}$ can be decreased. Moreover, the stray capacitance of the lines in the circuit can be decreased. As a result, a semiconductor memory device which operates at a high speed can be obtained.

Next, with reference to FIG. 9, a fourth embodiment will be described.

The feature of the fourth embodiment is in that by changing the positions and connections of the four NMOS transistors of each XOR shown in FIG. 5, the influence of a stray resistance caused by the polysilicon used for wiring is decreased so as to increase the operating speed of the apparatus.

First, the positions of the transistors will be described.

The gate of NMOS 31 is composed of a first polysilicon layer PL401. The gate of NMOS 34 is composed of a first polysilicon layer PL402. The first polysilicon layers PL401 and PL402 are disposed in parallel with the Y axis. The NMOSs 31 and 34 share a diffused region DFF11 as their drains. The NMOS 31 is opposed to NMOS 33 in the Y axis direction. The gate of the NMOS 33 is composed of a first polysilicon layer PL403 disposed on an extended line of the first polysilicon layer PL401. The NMOS 34 is disposed to NMOS 32 in the Y axis direction. In addition, the NMOS 33 is opposed to the NMOS 32 in the X axis direction. The gate of the NMOS 32 is composed of a first polysilicon layer PL404 disposed on an extended line of the first polysilicon layer PL402. The NMOSs 33 and 32 share a diffused region DFF21 as their drains.

Next, the connections of the transistors will be described.

The diffused region DFF11 is connected to the first metal layer 403 through a second contact hole CH2. The first metal layer ML403 is connected to an even output terminal EO. The DFF21 is connected to the first metal layer ML404 through the second contact hole CH2. The first metal layer ML404 is connected to an odd output terminal OO. A diffused region DFF12 which is the source of the NMOS 31 and a diffused region DFF23 which is the source of the NMOS 33 are connected straightly through the second contact hole CH2 with the first metal layer ML401 connected to an even input terminal EI. A diffused region DFF13 which is the source of the NMOS 34 and a diffused region DFF22 which is the source of the NMOS 32 are straightly connected through the second contact hole CH2 with the first metal layer ML402. The first metal layer ML402 is connected to the odd input terminal OI.

The first polysilicon layers PL401, PL402, and PL403 are provided with their electrode lead portions. The first polysilicon layer PL401 is connected to a fourth polysilicon layer PL41 through the first contact hole CH1. The first polysilicon layers PL402 and PL403 are connected to a fourth polysilicon layer PL42 through the first contact hole CH1. The first polysilicon layers PL401 and PL404 are connected with the first polysilicon layer PL410.

In the above-mentioned construction, the first polysilicon layers PL402 and PL403 are connected through the fourth polysilicon layer PL42. Instead, a fourth polysilicon layer (not shown in the figure) which is intersected with the first polysilicon layer PL410 can be disposed so that the fourth polysilicon layer causes the first polysilicon layers PL402 and PL403 to be connected.

In the above-mentioned positions and connections of the transistors, the NMOS 31 and NMOS 33 which are connected to the even input terminal EI can be opposed each other. In addition, the NMOS 34 and NMOS 32 which are connected to the odd input terminal OI can be opposed each other. Moreover, the gates of the NMOS 31 and NMOS 32 are substantially intersected with each other. Thus, during the operation of the device, a stray resistance caused by the fourth polysilicon layer affects as a series resistance neither a path formed by the even/odd input line pair EOI nor a path formed by the even/odd output wire pair EOO. Therefore, when XORs are cascade-connected, a large number of stray resistances are not connected in series. As a result, XOR matrix circuits 130, 230, and 330 which operate at high speeds can be obtained.

According to the first to fourth embodiments and the, combinations thereof, the semiconductor memory device with built-in ECC circuit which has a high density of integration and high operating speed can be accomplished.

It should be noted that the present invention is not limited to the above-mentioned embodiments. In other words, a variety of modifications of the present invention can be accomplished. Examples of the modifications are as follows.

(a) Although the syndrome decoder 40 shown in FIG. 1 comprises decode gates 41 and 42 which are NAND gates, other types of gates can be also used.

(b) In the construction shown in FIG. 9, since the drains of the NMOS 31 to 34 constructing an XOR are compatible with the sources thereof, they can be inversely used. In addition, the first metal layer ML401 which connects the diffused regions DFF12 and DFF23 and the first metal layer ML402 which connects the diffused regions DFF13 and DFF22 can be composed of a different type of wiring material. Moreover, each XOR can be composed of P channel type MOS transistors (PMOS) or a combination of the NMOS transistors and PMOS transistors.

What is claimed is:

1. A semiconductor memory device with built-in error correcting code circuitry, comprising:

a memory cell array for storing a plurality of information bits and a plurality of parity bits, said memory cell array comprising a plurality of memory cells for storing said information bits or said parity bits;

a register circuit, operatively coupled to said memory cell array, for temporarily holding said plurality of information bits and said plurality of parity bits, said register circuit including a plurality of information bit register circuits for temporarily holding said plurality of information bits and a plurality of parity bit register circuits for temporarily holding said plurality of parity bits;

an exclusive-OR (XOR) circuit, operatively coupled to said register circuit, for detecting an error of logical values of a plurality of information bits and a plurality of parity bits temporarily held in said register circuit in accordance with a predetermined verifying matrix, said XOR circuit including a plurality of XORs each having a first input line pair for receiving information in a first direction, a second input line pair for receiving information in a second direction perpendicular to said first direction, and an output line pair outputting XOR logical values in said second direction, said XOR circuit including an information bit XOR circuit and a parity bit XOR circuit, wherein the information bit XOR circuit has n rows of XOR line circuits extending in a third direction each of which includes:

a first XOR having a first input line pair coupled for receiving one of the information bits in a fourth direction perpendicular to the third direction, a second input line pair comprised of metal, the second input line pair coupled for receiving a predetermined signal from the third direction, and an output line pair comprised of metal, and second to m-th XORs, each having a first input line pair coupled for receiving one of the information bits in the fourth direction, a second input line pair comprised of metal, the second input line pair coupled to the output line pair of the preceding XOR for receiving an output signal of the preceding XOR in the third direction, and an output line pair comprised of metal, where n and m are integers greater than 1, wherein the parity bit XOR circuit includes a plurality of XORs, each of which has a first input line pair coupled to one of the output line pairs of the m-th XORs for receiving an output signal of the m-th XORs in the third direction, a second input line pair comprised of metal, the second input line pair coupled for receiving the parity bit from the fourth direction, and an output line pair comprised of metal for outputting the error information bit in the fourth direction; and a decode circuit for correcting a bit error of a plurality of information bits and a plurality of parity bits temporarily held in said register circuit in accordance with the error information bit.

2. The semiconductor memory device as set forth in claim 1, wherein a combination of said information bits and said parity bits stored in said memory cells comprises data.

3. The semiconductor memory device as set forth in claim 1, wherein transistors forming each information bit XOR and each parity bit XOR of said XOR circuits are n-channel MOS transistors.

4. The semiconductor memory device as set forth in claim 1, wherein said decode circuit comprises:

an information bit decode circuit for said information bits, and a parity bit decode circuit for said parity bits, wherein said information bit decode circuit comprises a gate circuit for sending an error correction signal in accordance with an error detection result of said XOR circuit, and wherein said parity bit decoder circuit comprises a gate circuit for sending an error correcting signal in accordance with an error detection result of said XOR circuit and a switching circuit for sending an error correction signal when information bits and parity bits are read from said memory cell array and for sending an error detection result of said XOR circuit when information bits and parity bits are written to said memory cell array.

5. The semiconductor memory device as set forth in claim 1, wherein each XOR of said XOR circuit comprises first, second, third and fourth MOS transistors, the first and second MOS transistors and the third and fourth MOS transistors sharing a diffused region as sources or drains thereof, the first and third MOS transistors being opposed to the second and fourth MOS transistors so that gates thereof are substantially disposed on the same line, a gate of the first MOS transistor being extended and connected to a gate of the fourth MOS transistor.

6. A semiconductor memory device with built-in error correcting code circuitry, comprising:

a memory cell array for storing a plurality of information bits and a plurality of parity bits, said memory cell array comprising a plurality of memory cells for storing said information bits or said parity bits;

a register circuit, operatively coupled to said memory cell array, for temporarily holding said plurality of information bits and said plurality of parity bits, said register circuit including a first information bit register circuit group for temporarily holding a first one of two blocks into which said plurality of information bits are divided, a second information bit register circuit group for temporarily holding a second one of the two blocks thereof, and a plurality of parity bit register circuits for temporarily holding said plurality of parity bits;

an exclusive-OR (XOR) circuit, operatively coupled to said register circuit, for detecting an error of logical values of a plurality of information bits and a plurality of parity bits temporarily held in said register circuit in accordance with a predetermined verifying matrix, said XOR circuit including a plurality of XORs, each having an input line pair for receiving information in a first direction, a second input line pair for receiving information in a second direction perpendicular to said first direction, and an output line pair outputting XOR logical values in said second direction, said XOR circuit including a first information bit XOR circuit group, a second information bit XOR circuit group, and parity bit XOR circuit group, said first information bit XOR circuit group and said second information bit XOR circuit group each having:

n rows of first line circuits extending in a third direction each of the first line circuits including a first XOR having a first input line pair coupled for receiving one of the information bits in a fourth direction perpendicular to the third direction, a second input line pair comprised of metal, the second input line pair coupled for receiving a predetermined signal in the third direction, and an output line pair comprised of metal, and having second to m-th XORs, each having a first input line pair coupled for receiving one of the information bits, a second input line pair comprised of metal, the second input line pair coupled to an output line pair of a preceding XOR in the third direction, and an output line pair comprised of metal, wherein n and m are integer greater than 1, the parity bit XOR circuit group having n columns of second line circuits extending in the fourth direction, each of which includes:

a first XOR having a first input line pair coupled to the output line pair of the m-th XORs in one of the two information bit XOR circuit groups, a second input line pair comprised of metal, the second input line pair coupled for receiving the parity bit in the third direction, and an output line pair comprised of metal, and a second XOR having a first input line pair coupled to the second information bit XOR circuit group, a second input line pair comprised of metal, the second input line pair coupled to the output line pair of said first XOR of the second line circuit in third direction, and an output line pair comprised of metal, for outputting the error information bit in third direction; and a decode circuit for correcting a bit error of a plurality of information bits and a plurality of parity bits temporarily held in said register circuit in accordance with the error information bit.

7. The semiconductor memory device as set forth in claim 6, wherein a combination of said information bits and said parity bits stored in said memory cells comprises data.

8. The semiconductor memory device as set forth in claim 6, wherein said first and second information bit XOR groups and said parity bit XOR group of said XOR circuit comprise a plurality of transistors, and wherein said plurality of transistors are n-channel MOS transistors.

9. The semiconductor memory device as set forth in claim 6, wherein said decode circuit comprises gate circuits for sending error correction signals in accordance with error correction results of said XOR circuit, and a switching circuit for sending an error correction signal when information bits and parity bits are read from said memory cells and for sending an error detection signal of said XOR circuit when the information bits and parity bits are written to said memory cells.

10. The semiconductor memory device as set forth in claim 6, wherein the first information bit XOR group of said XOR circuit accords with a first minor matrix of said verifying matrix, the second information bit XOR group thereof accords with a second minor matrix, where said first minor matrix and a unit matrix are excluded from said verifying matrix.

11. The semiconductor memory device as set forth in claim 10, wherein said first and second information bit XOR group is disposed in accordance with matrix elements with "1" of said first and second minor matrixes, respectively.

12. The semiconductor memory device as set forth in claim 10, wherein said second information bit XOR group accords with a third minor matrix, where each column vector of said second minor matrix is cyclically shifted by a predetermined number of bits.

13. The semiconductor memory device as set forth in claim 12, wherein said second information bit XOR group is disposed in accordance with matrix elements with "1" of said third minor matrix.

14. The semiconductor memory device as set forth in claim 13, wherein said parity bit XOR group accords with a matrix where a unit matrix is added to a fourth minor matrix which is cyclically shifted in a direction different from a direction of cyclic shifting of said second information bit XOR group.

15. The semiconductor memory device as set forth in claim 6, wherein each XOR of said XOR circuit comprises first, second, third and fourth MOS transistors, the first and second MOS transistors and the third and fourth MOS transistors sharing a diffused region as sources or drains thereof, the first and third MOS transistors being opposed to the second and fourth MOS transistors so that gates thereof are substantially disposed on the same line, a gate of the first MOS transistor being extended and connected to a gate of the fourth MOS transistor.

* * * * *